(12) United States Patent
Kim

(10) Patent No.: US 8,351,317 B2
(45) Date of Patent: Jan. 8, 2013

(54) LASER IRRADIATION APPARATUS, IRRADIATION METHOD USING THE SAME, AND METHOD OF CRYSTALLIZING AMORPHOUS SILICON FILM USING THE SAME

(75) Inventor: Ji-Hwan Kim, Yongin (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 12/946,715

(22) Filed: Nov. 15, 2010

(65) Prior Publication Data

US 2011/0121205 A1    May 26, 2011

(30) Foreign Application Priority Data

Nov. 23, 2009  (KR) .................. 10-2009-0113426

(51) Int. Cl.
*G11B 7/00* (2006.01)
(52) U.S. Cl. .................... 369/121; 250/492.2
(58) Field of Classification Search .................. 369/103, 369/112.29, 13.28, 44.37, 121; 250/492.1, 250/492.2; 438/487, 795; 372/9
See application file for complete search history.

(56) References Cited

U.S. PATENT DOCUMENTS

| 6,741,621 | B2 * | 5/2004 | Asano | 372/28 |
| 7,405,376 | B2 * | 7/2008 | Kobayashi et al. | 219/121.68 |
| 2002/0088782 | A1 * | 7/2002 | Morita | 219/121.73 |
| 2003/0201410 | A1 * | 10/2003 | Nagamura | 250/559.45 |

FOREIGN PATENT DOCUMENTS

| JP | 08-148423 A | | 6/1996 |
| JP | 08148423 A | * | 6/1996 |
| KR | 100283254 B1 | | 6/2000 |
| KR | 10-2005-0054788 A | | 6/2005 |
| KR | 10-2008-0077794 A | | 8/2008 |
| KR | 10-2009-0008942 A | | 1/2009 |

* cited by examiner

*Primary Examiner* — Thang Tran
(74) *Attorney, Agent, or Firm* — Knobbe Martens Olson & Bear LLP

(57) ABSTRACT

Provided are a laser irradiation apparatus, an irradiation method using the same, and a method of crystallizing an amorphous silicon film using the same. Particularly, a laser irradiation apparatus which can reduce a deviation of an intensity of a laser beam, an irradiation method using the same, and a method of crystallizing an amorphous silicon film using the same, which can improve uniformity in crystallization into a polycrystalline silicon thin film, are provided.

15 Claims, 3 Drawing Sheets

LASER IRRADIATION APPARATUS, IRRADIATION METHOD USING THE SAME, AND METHOD OF CRYSTALLIZING AMORPHOUS SILICON FILM USING THE SAME

CROSS-REFERENCE TO RELATED APPLICATIONS

This application claims the benefit of Korean Patent Application No. 10-2009-0113426, filed Nov. 23, 2009, the disclosure of which is hereby incorporated herein by reference in its entirety.

BACKGROUND OF THE INVENTION

1. Field of the Invention

Aspects of the present embodiments relate to a laser irradiation apparatus, an irradiation method using the same, and a method of crystallizing an amorphous silicon film. Some embodiments relate to a laser irradiation apparatus which can reduce deviation of the intensity of a laser beam, an irradiation method using the same, and a method of crystallizing an amorphous silicon film which can improve uniformity in crystallization into a polycrystalline silicon thin film.

2. Description of the Related Art

Flat panel display devices such as an organic light emitting diode (OLED) display device or TFT-LCD devices have been widely studied because they can be fabricated in a very thin and flexible structure due to driving characteristics.

Among these flat panel display devices, an active matrix flat panel display device has a pixel circuit disposed in each pixel, and the pixel circuit adjusts and drives an emitting element of each pixel in response to signals applied from a scan line and a data line.

Each pixel circuit includes a thin film transistor, which includes an active layer having a channel. The active layer is generally formed of amorphous silicon or polycrystalline silicon.

While the thin film transistor using the amorphous silicon can be deposited at low temperature, it cannot be used for a large-sized display device. For this reason, polycrystalline silicon has been widely used to fabricate thin film transistors. Polycrystalline silicon is suitable for a large-sized flat panel display device due to high mobility, a high-frequency operating characteristic and a low leakage current.

Such polycrystalline silicon is formed by crystallizing amorphous silicon by a predetermined crystallization method, which is usually laser crystallization.

A laser annealing process of forming an active layer, e.g., a poly-silicon layer, on a substrate is performed by irradiating a linear laser beam having a predetermined length and width to an entire surface of the substrate. The linear laser beam is scanned over the substrate and overlaps to irradiate.

Usually, a pulse laser beam of an excimer laser is used as the laser beam for laser annealing.

The oscillated laser beam is not uniform in every case, which may be caused by a change in temperature due to heating of a laser oscillator, and changes in temperature and deflection of a condenser lens of an optical system.

The non-uniformity of the laser beam results in non-uniform crystallization, which results in a non-uniform resistance generated during fabrication of a thin film transistor. Thus, the non-uniform crystallization can be a direct cause of product defects.

SUMMARY OF THE INVENTION

Aspects of the present embodiments provide a laser irradiation apparatus which can improve uniformity in crystallization of a polycrystalline silicon thin film by reducing deviation between non-uniform laser beams, an irradiation method using the same, and a method of crystallizing an amorphous silicon film using the same.

According to an aspect of the present embodiments, a laser irradiation apparatus includes a laser oscillator configured to oscillate a laser beam, and an optical system disposed in front of the laser oscillator, and configured to modify the laser beam and irradiate the modified beam to a subject. The optical system includes a beam splitter configured to split the laser beam and a luminous flux adjuster configured to adjust the flux of the laser beam split by the beam splitter.

According to another aspect of the present embodiments, a method of irradiating laser to a subject using a laser oscillator and an optical system includes modifying a laser beam emitted from the laser oscillator using the optical system, and irradiating the modified laser beam to a subject. The optical system splits the laser beam using the beam splitter, and adjusts the flux of the split laser beam using a luminous flux adjuster to irradiate.

According to still another aspect of the present embodiments, a method of crystallizing an amorphous silicon film into a polycrystalline silicon film by laser irradiation includes splitting a laser beam oscillated from a laser oscillator using a beam splitter, and adjusting a flux of the split laser beam through a luminous flux adjuster to irradiate.

Additional aspects and/or advantages of the embodiments will be set forth in part in the description which follows and, in part, will be obvious from the description, or may be learned by practice of the embodiments.

BRIEF DESCRIPTION OF THE DRAWINGS

The above and other objects, features and advantages of the present embodiments will be described in reference to predetermined exemplary embodiments thereof with reference to the attached drawings in which.

DETAILED DESCRIPTION OF THE INVENTION

Figure 1:
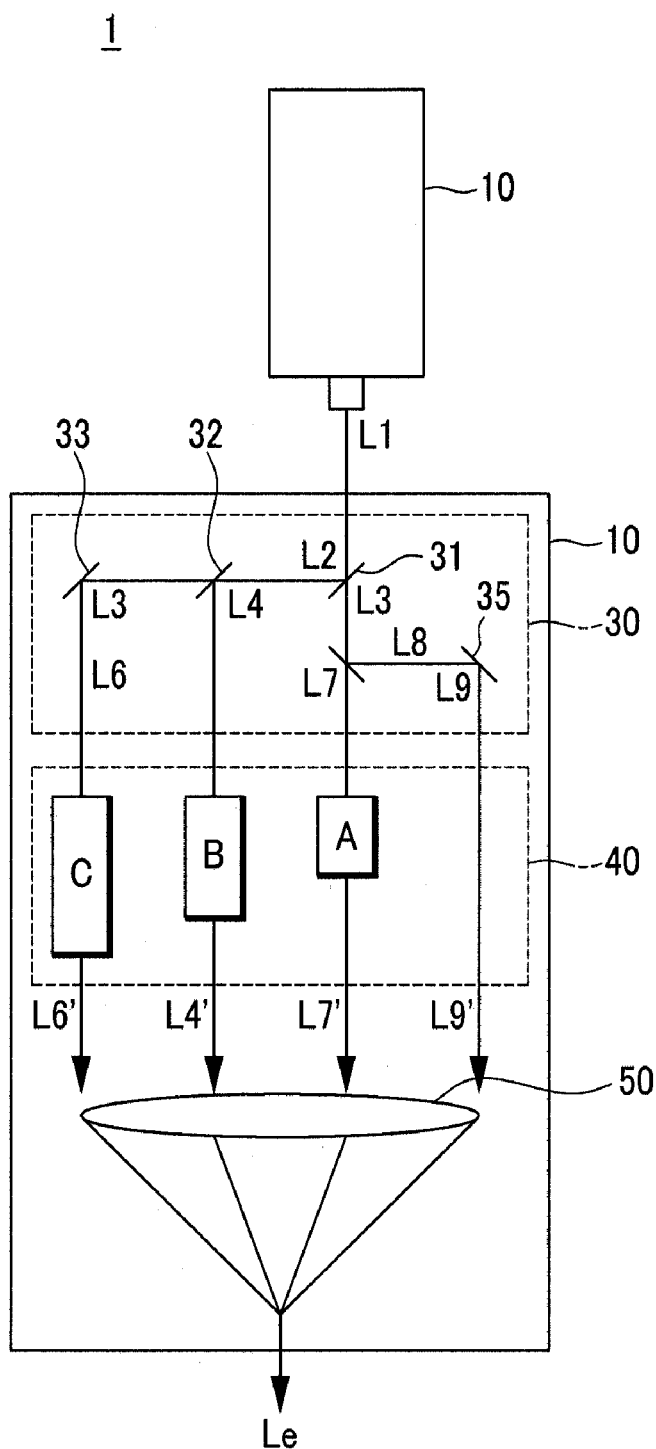
FIG. 1 shows an example of a laser irradiation apparatus according to the present embodiments.

The present embodiments will now be described more fully hereinafter with reference to the accompanying drawings, in which exemplary embodiments are shown. Like numerals denote the like elements throughout the specifications, and when one part is "connected with another part", these parts may be "directly connected" with each other, or "electrically connected" with each other having a third device therebetween. Moreover, in the drawings, thicknesses of layers and regions may be exaggerated for clarity.

Figure 2:
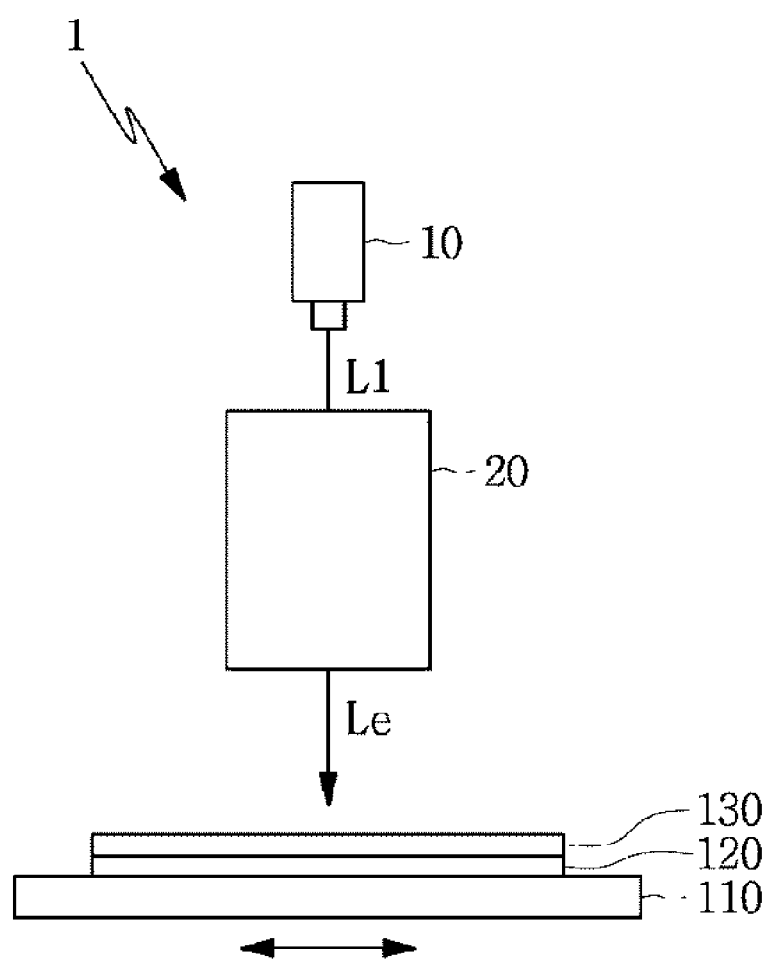
FIGS. 2 and 3 are a diagram and a timing diagram which schematically illustrate a method of crystallizing amorphous silicon using the laser irradiation apparatus shown in FIG. 1, respectively.
Figure 3:
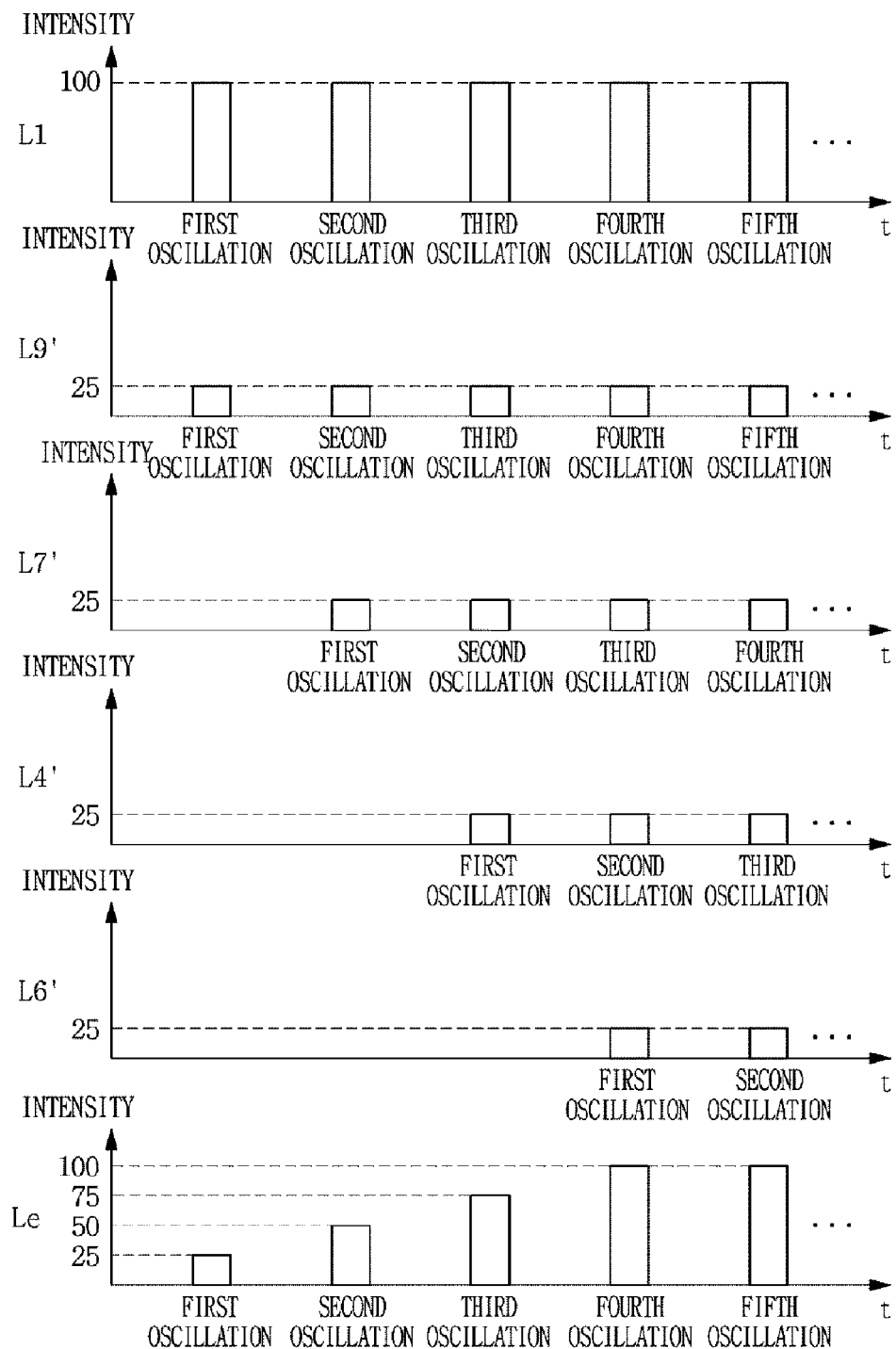

FIG. 1 shows an example of a laser irradiation apparatus according to the present embodiments, and FIGS. 2 and 3 are a diagram and a timing diagram which schematically illustrate a method of crystallizing amorphous silicon using the laser irradiation apparatus shown in FIG. 1, respectively.

Referring to FIG. 1, an example of a laser irradiation apparatus 1 according to the present embodiments includes a laser oscillator 10 and an optical system 20 including a beam splitter 30 and a luminous flux adjuster 40.

In the exemplary embodiment, the optical system 20 according to the present embodiments includes the beam splitter 30 and the luminous flux adjuster 40, but various shapes and configurations can be applied to the present embodiments.

The laser oscillator 10 is an apparatus oscillating a pulse-type laser beam, and oscillating a laser beam having a specific wavelength into a pulse having a specific frequency. Preferably, the laser oscillator 10 may be an excimer laser.

The optical system 20 is disposed in front of the laser oscillator 10 to modify the laser beam oscillated from the laser oscillator 10 and irradiate the modified beam to a subject. The irradiated laser beam is a linear laser beam having a rectangular area.

The optical system 20 splits the laser beam in a predetermined ratio, and includes the beam splitter 30 having a plurality of mirrors 31 to 35 and the luminous flux adjuster 40 adjusting the flux of each laser beam split by the beam splitter 30.

The beam splitter 30 includes the plurality of mirrors 31 to 35, and thus splits a laser beam in a predetermined ratio using reflectance and transmittance of each mirror. The laser beam may be split into laser beams having various intensities according to the purpose.

The number of the split laser beams is determined by the number and arrangement of the mirrors included in the beam splitter 30.

The luminous flux adjuster 40 includes a plurality of media A, B and C to adjust the flux of the laser beams split by the beam splitter 30 according to characteristics of the media A, B and C.

However, the luminous flux adjuster may include one or more media according to the number of the split laser beams.

The plurality of media A, B and C correspond to the split laser beams, respectively. However, among the split laser beams, one that is not necessary to be adjusted in flux may be in no correspondence with any medium.

The media A, B and C to adjust the flux of the laser beams may be a means to which a method of reducing the flux of light, for example, using an ultra gold atomic gas or hot vapor, but the present embodiments are not limited thereto.

Referring to the configuration shown in FIG. 1, the splitting method using the beam splitter 30 and the luminous flux adjuster 40 is briefly described as splitting the laser beam oscillated from the laser oscillator 10 having an intensity of 100% into four beams having an intensity of about 25% each by the beam splitter 30, but the present embodiments are not limited thereto.

In some embodiments, a first laser beam L1 having an intensity of 100% oscillated from the laser oscillator 10 is split into second and third laser beams L2 and L3 by a first mirror 31. The first mirror 31 has a transmittance of about 50%, and each of the second and third laser beams L2 and L3 has an intensity of about 50%.

The second laser beam L2 is split again into fourth and fifth laser beams L4 and L5 by a second mirror 32. The second mirror 32 has a transmittance of about 50%, and each of the fourth and fifth laser beams L4 and L5 has an intensity of about 25%.

The fifth laser beam L5 forms a sixth laser beam L6 whose path is changed by a third mirror 33 having a reflectance of about 100%.

The third laser beam L3 is split into seventh and eighth laser beams L7 and L8 by a fourth minor 34, which has a transmittance of about 50%. Each of the seventh and eighth laser beams L7 and L8 has an intensity of about 25%.

The eighth laser beam L8 forms a ninth laser beam L9 whose path is changed by a fifth mirror 35 with a reflectance of about 100%.

Accordingly, the first laser beam L1 having an intensity of 100% passes through the beam splitter 30, and then is split into four laser beams L4, L6, L7 and L9 having the same intensity of about 25% as one another.

Among the four laser beams, the ninth laser beam L9 does not pass through a medium, and the other three laser beams L7, L4 and L6 pass through media A, B and C, respectively.

Thus, the laser beam L1 having an intensity of 100%, which is oscillated from the laser oscillator through the optical system 20 is emitted after being split into four laser beams L9', L7', L4' and L6' each having an intensity of about 25%.

The four laser beams L9', L7', L4' and L6' may be emitted at intervals according to the characteristics of the media A, B and C. Various orders of outputting the laser beams are possible, and for example, the laser beam L9', which does not pass through a medium, is output, the laser beams L7' and L4' passing through the media A and B, respectively, are output, and the laser beam L6' passing through the medium C is output.

While, in the present embodiment, the four split laser beams L9', L7', L4' and L6' are independently output, the four split laser beams L9', L7', L4' and L6' may be condensed through a condensing lens, which can be included in front of the luminous flux adjuster 40, before being output.

Referring to FIGS. 2 and 3, a method of crystallizing an amorphous silicon film using the laser irradiation apparatus shown in FIG. 1 will be described.

However, in the present embodiment, it is provided that the laser beams are not independently emitted from the optical system 20 after being split, but are simultaneously emitted after the split laser beams are condensed in the optical system 20. The internal configuration of the optical system 20 will be referred to FIG. 1 without further description.

It is also provided that the interval in time between oscillation and emission according to media becomes shorter in an order of media A, B and C. Delay time becomes longer from media A through C, and an intensity of the laser beam output from the laser oscillator 10 to crystallize amorphous silicon is provided to be about 100%.

First, examining a change in intensity of the laser beam output from the optical system 20 according to time with reference to FIG. 3, when a first laser beam L1 having an intensity of about 100 is oscillated from the laser oscillator 10, due to the different delay time of media A through C, the final intensity of the first laser beam Le output from the optical system 20 is the same as the intensity of the laser beam L9' that does not pass through a medium, which is 25. Hereinafter, the laser beam emission from the optical system 20 is called a final laser beam (oscillation).

Afterwards, when a second laser beam L1 having an intensity of 100 is oscillated from the laser oscillator 10, the final intensity of the second laser beam (oscillation) Le is the same as the sum of the intensity of the second laser beam (oscillation) L9' that does not pass through a medium and the intensity of the first laser beam (oscillation) L7' passing through the medium A. The final intensity of the second laser beam (oscillation) Le is about 50%.

When a third laser beam L1 having an intensity of 100% is then oscillated from the laser oscillator 10, the final intensity of the third laser beam Le is the same as the sum of the intensity of the third laser beam L9' that does not pass through a medium, the intensity of the second laser beam L7' passing through the medium A, and the intensity of the first laser beam L4' passing through the medium B. The final intensity of the third laser beam Le is about 75%.

When a fourth laser beam L1 having an intensity of 100 is then oscillated from the laser oscillator 10, the final intensity of the fourth laser beam Le is the same as the sum of the intensity of the fourth laser beam L9' that does not pass through a medium, the intensity of the third laser beam L7' passing through the medium A, the intensity of the second laser beam L4' passing through the medium B, and the intensity of the first laser beam L6' passing through the medium C. The final intensity of the fourth laser beam Le is about 100%.

As a result, the intensity of the laser beam finally output from the optical system 20 from the time when the fourth laser beam is oscillated is the same as the intensity of the laser beam initially oscillated from the laser oscillator 10.

Referring to FIG. 2, a substrate 120 having an amorphous silicon film 130 is placed on a stage 110 configured to move, and a laser irradiation apparatus 1 is installed to face the amorphous silicon film 130.

Alternatively, the stage 110 may be fixed, and the laser irradiation apparatus 1 may be configured to move.

The laser irradiation apparatus 1 has the same configuration as that shown in FIG. 1, and follows the timing diagram shown in FIG. 3 until the laser beam L1 oscillated from the laser oscillator 10 is output as a final laser beam through the optical system 20.

According to the timing diagram shown in FIG. 3, the first through third oscillated laser beams do not have sufficient intensities to crystallize an amorphous silicon film, and thus are not used for a crystallization process.

From the time when the fourth laser beam is oscillated, the laser irradiation apparatus 1 irradiates a laser beam to the amorphous silicon film 130, thereby crystallizing the amorphous silicon film 130.

The laser beam oscillated from the laser oscillator 10 is split into a plurality of laser beams, which are output from the optical system 20 at different intervals, and irradiated to the same region of the amorphous silicon film.

From the time when the sum of intensities of the laser beam output at different intervals is the same as an intensity of the laser beam oscillated from the laser oscillator 10, the laser beams are irradiated to the amorphous silicon film to crystallize it.

Likewise, when the laser beam oscillated from the laser oscillator 10 is split, and the split laser beams are condensed to crystallize the amorphous silicon film, a deviation between non-uniform intensities of the laser beam can be reduced.

For example, when the laser beam oscillated from the laser oscillator does not have an intensity of 100%, but about 80%, the laser beam irradiating the amorphous silicon film has an intensity of about 80%.

However, according to the exemplary embodiment even if one of the four laser beams has an intensity of about 80%, but the other three laser beams have intensities of 100%, the intensity of the laser beam irradiated to the amorphous silicon film can have an intensity of about 95%, which is an average intensity of the four laser beams. Thus, the deviation of the intensities of the laser beams is reduced.

According to the present embodiments, uniformity in crystallinity of a polycrystalline silicon thin film can be improved by reducing a deviation between non-uniform uniform laser beams.

Although the present embodiments have been described with reference to predetermined exemplary embodiments thereof, it will be understood by those skilled in the art that a variety of modifications and variations may be made to the present embodiments without departing from the spirit or scope of the present embodiments defined in the appended claims and their equivalents.

What is claimed is:

1. A laser irradiation apparatus, comprising:
    a laser oscillator configured to oscillate a laser beam at intervals; and
    an optical system disposed in front of the laser oscillator, and configured to modify the laser beam and irradiate the modified beam to a subject,
    wherein the optical system includes a beam splitter configured to split the laser beam to a plurality of split laser beams and a luminous flux adjuster configured to adjust the flux of the individual split laser beams, so as to sequentially emit each of the split laser beams at intervals from the luminous flux adjuster,
    wherein the intervals of the laser beam from the laser oscillator are the same as the intervals of the split laser beam from the luminous flux adjuster, and
    wherein the optical system further comprises a condensing lens disposed in front of the luminous flux adjuster, configured to condense the split laser beams and emit them as one laser beam.

2. The apparatus according to claim 1, wherein the beam splitter includes a plurality of mirrors having a predetermined reflectance and a predetermined transmittance.

3. The apparatus according to claim 1, wherein the luminous flux adjuster includes one or more media corresponding to the split laser beams, and wherein the luminous flux adjuster individually adjusts the flux of the split laser beam according to characteristics of the one or more media.

4. The apparatus according to claim 1, wherein the split laser beams have uniform intensities.

5. A method of irradiating laser comprising:
    oscillating a laser beam from a laser oscillator at intervals;
    splitting the laser beam to a plurality of split laser beams using a beam splitter of an optical system;
    adjusting the flux of the individual split laser beams to sequentially emit each of the split laser beams at intervals using a luminous flux adjuster of the optical system;
    condensing the split laser beams using a condensing lens disposed in front of the luminous flux adjuster, and
    irradiating the split laser beams as one laser beam to a subject
    wherein the intervals of the laser beam from the laser oscillator are the same as the intervals of the split laser beam from the luminous flux adjuster.

6. The method according to claim 5, wherein the split laser beams have uniform intensities.

7. The method according to claim 5, wherein the luminous flux adjuster further comprises one or more media corresponding to the split laser beams wherein the luminous flux adjuster individually adjusts the flux of the split laser beam according to characteristics of one or more media corresponding to the split laser beams.

8. The method according to claim 5, wherein the split laser beams are irradiated to the same region of the subject.

9. A method of crystallizing an amorphous silicon film into a polycrystalline silicon film by irradiating laser, comprising:
    oscillating a laser beam from a laser oscillator at intervals;
    splitting the laser beam to a plurality of split laser beams using a beam splitter of an optical system
    adjusting the flux of the individual split laser beams to sequentially emit each of the split laser beams at intervals using a luminous flux adjuster of the optical system;
    condensing the split laser beams using a condensing lens disposed in front of the luminous flux adjuster, and
    irradiating the split laser beams as one laser beam to a subject, wherein the intervals of the laser beam from the laser oscillator is same as the intervals of the split laser beam from the luminous flux adjuster.

10. The method according to claim 9, wherein the laser beam is irradiated to the amorphous silicon layer from the time when an intensity of the laser beam passing through condensing lens as one laser beam is the same as an intensity of the laser beam oscillated from the laser oscillator.

11. The method according to claim 9, wherein the luminous flux adjuster further comprises one or more media corresponding to the split laser beams wherein the luminous flux adjuster individually adjusts the flux of the split laser beam according to characteristics of one or more media corresponding to the split laser beams.

12. The method according to claim 11, wherein the split laser beams are emitted at intervals through corresponding media included in the luminous flux adjuster.

13. The method according to claim 9, wherein the split laser beams have uniform intensities.

14. The method according to claim 9, wherein the split laser beams are irradiated to the same region of the amorphous silicon layer.

15. The method according to claim 9, wherein the beam splitter includes a plurality of mirrors having a predetermined reflectance and a predetermined transmittance.

* * * * *